CIRCUIT FOR CONVERTING SINUSOIDAL SIGNALS INTO SYMMETRICAL SQUARE WAVE SIGNALS

Filed Aug. 3, 1966

INVENTOR
H. R. LEHMAN
BY Lucian C. Canepa
ATTORNEY

United States Patent Office 3,502,911
Patented Mar. 24, 1970

3,502,911

CIRCUIT FOR CONVERTING SINUSODIAL SIGNALS INTO SYMMETRICAL SQUARE WAVE SIGNALS

Harvey R. Lehman, New York, N.Y., assignor to Bell Telephone Laboratories, Incorporated, Murray Hill and Berkeley Heights, N.J., a corporation of New York Filed Aug. 3, 1966, Ser. No. 569,900
Int. Cl. H03k 5/00
U.S. Cl. 307—261 3 Claims

ABSTRACT OF THE DISCLOSURE

A circuit is disclosed which converts sinusoidal signals into symmetrical square wave signals. The circuit includes a differential transistor pair arranged in the common emitter configuration and apparatus for maintaining the bases of the transistor pair at constant and equal voltage levels during quiescent operation. This apparatus comprises a Zener diode connecting the base of one of the transistors to ground and a capacitor and inductor arranged in parallel and interconnecting the bases of the transistors. This configuration insures a symmetrical output in spite of biasing source drift.

Figure 1:
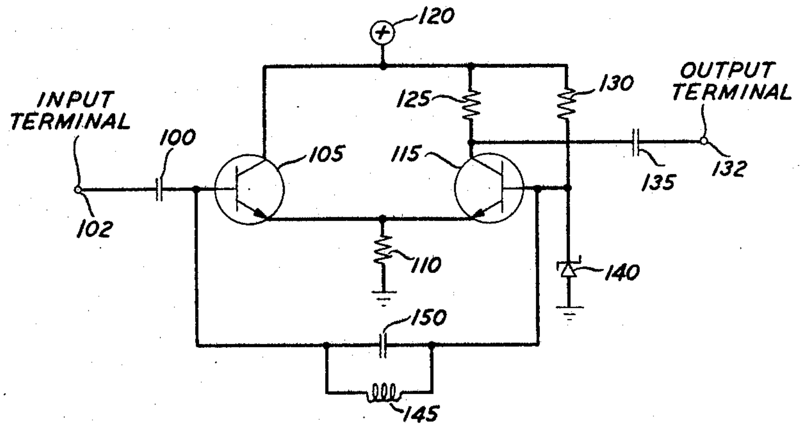

This invention relates to wave shaping circuits and more particularly to circuits for converting sinusoidal signals to symmetrical square wave signals.

One of the primary problems associated with the conversion of sinusoidal signals into square wave signals is the maintenance of square-wave symmetry in the face of circuit drift. For example, in wave shaping circuits utilizing a differential transistor pair arranged in the common-emitter configuration, separate and independent transistor biasing sources are often times employed which if they are not maintained at relatively constant levels cause the generation of asymmetrical square wave signals.

Accordingly, it is an object of this invention to provide for the conversion of sinusoidal signals into symmetrical square wave signals despite biasing source drift.

It is another object of this invention to provide for maintaining the bases of a transistor pair arranged in the common-emitter configuration at a constant and equal voltage level during quiescent operation.

These and other objects of the present invention are realized in accordance with one specific illustrative embodiment which comprises a pair of transistors arranged in the differential common-emitter configuration, a capacitor and inductor arranged in parallel connecting the bases of the two transistors and tuned to block the sinusoidal input signals, a positive voltage source connected through a resistor to the base of the second transistor, and a reverse-breakdown or Zener diode connecting the base of the second transistor to ground. The input terminal of the circuit is connected through a capacitor to the base of the input transistor. The output terminal is connected through a capacitor to the collector of the second transistor which in turn is connected through a resistor to the positive voltage source.

The base voltages of the two transistors are maintained at an equal level during quiescent operation of the circuit by the voltage source, Zener diode, and parallel capacitor-inductor configuration. Application of a sinusoidal input signal to the base of the input transistor causes a change in the base-to-emitter voltage level of the second transistor, resulting in the generation of a symmetrical square wave output signal.

It is a feature of this invention that circuitry comprising a capacitor and inductor arranged in parallel and capable of blocking the A-C input voltages while passing D-C voltages be provided for maintaining the bases of the transistor pair at an equal voltage level during quiescent operation.

It is another feature of this invention that circuitry comprising a Zener diode and a positive voltage source and connected to the second transistor of the differential pair be provided for maintaining the base voltage of the second transistor at a constant level despite voltage source drift.

Figure 2A:
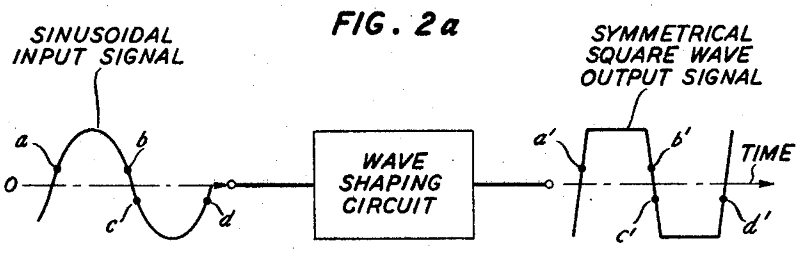
Figure 2B:
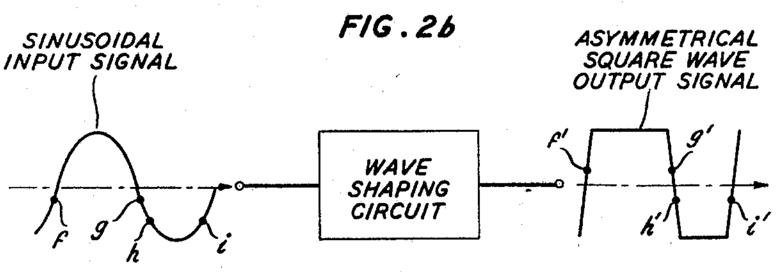

A complete understanding of the present invention and of the above and other objects, features and advantages thereof, may be gained from a consideration of the following detailed description of one specific illustrative embodiment presented hereinbelow in connection with the accompanying drawing, in which:

FIG. 1 is a detailed showing of a particular wave shaping circuit made in accordance with the principles of the present invention; and FIGS. 2*a* and 2*b* graphically represent the conversion of a sinusoidal input signal to a symmetrical and asymmetrical square wave respectively.

The wave shaping circuit shown in FIG. 1 comprises a differential transistor pair 105, 115 arranged in the common-emitter configuration. The base of the input transistor 105 is connected through a capacitor 100 to an input terminal 102. The collector of the input transistor is connected directly to a positive voltage source 120. The collector of the second transistor 115 is connected through a resistor 125 to the voltage source 120. The base of the second transistor 115 is connected through a resistor 130 to the positive voltage source 120 and also through a Zener diode 140 to ground. The base of the second transistor is also connected through a capacitor 150 and an inductor 145 arranged in parallel to the base of the input transistor 105. An output terminal 132 is connected through a capacitor 135 to the collector of the second transistor 115.

The voltage source 120 in conjunction with the Zener diode 140 maintains the base voltage of the transistor 115 at a constant level during all periods of operation. In order to do this, of course, the voltage source 120 must be chosen such that, absent the Zener diode 140, the voltage applied to the base of the transistor 115 would exceed the desired level. Inclusion of the Zener diode 140, however, results in the base voltage being maintained at the constant "breakdown" level characteristic of the particular Zener diode chosen. In other words, maintenance of the base voltage of the transistor 115 at some constant level is contingent upon choosing a Zener diode which will "breakdown" and conduct to ground when the voltage across the diode tends to exceed the desired level.

The inductor 145 shown in FIG. 1 effectively acts as a short circuit to the D-C voltage source 120 and thus the base of the input transistor 105 is maintained at the same level as the base voltage level of the second transistor 115 during quiescent operation.

Upon application of the positive portion of a sinusoidal input signal, the base voltage of the input transistor 105 increases, causing an increase in the common-emitter voltage of the transistor pair. The parallel inductor-capacitor circuit 145, 150 is tuned to reject the alternating input voltages so that the base voltage of the transistor 115 remains unchanged. Since the base voltage of the transistor 115 remains unchanged while the emitter voltage increases, the base-to-emitter voltage drop is decreased, thus turning the transistor 115 OFF. This, in turn, increases the voltage of the transistor's collector circuit and consequently the output voltage. The output volage (that which appears at the output terminal 132) is maintained at a constant level until the trailing edge of the positive portion of the input signal falls below a certain minimum amplitude. When it does, the transistor 115 assumes its quiescent or relatively low-conduction condition.

Application of the negative portion of the sinusoidal signal decreases the base voltage of the input transistor 105, decreasing the common-emitter voltage and increasing the base-to-emitter voltage drop of the transistor 115. This causes the transistor 115 to conduct more heavily with a consequent lowering of the output voltage. This high-conductive condition persists until the trailing edge of the negative portion of the input signal rises above a predetermined minimum amplitude.

In the fashion described, sinusoidal signals are converted to symmetrical square wave signals. This is shown graphically in FIG. 2*a*. Point *a* of the sinusoidal input signal of FIG. 2*a* represents the input voltage level sufficient to turn the transistor 115 OFF. Point *b* represents that level at which the transistor 115 would again assume its quiescent condition. Points *c* and *d* on the negative portion of the input signal represent the levels at which the transistor 115 would first begin to conduct more heavily and then assume its quiescent condition, respectively. The corresponding points on the output signal are indicated by the primed letters. As shown, the horizontal distance between *a* and *b* (and *a'* and *b'*) is equal to the horizontal distance between *c* and *d* (and *c'* and *d'*) indicating that the output signal is symmetric.

If the bases of the two transistors were not maintained at an equal voltage level during quiescent operation, then an *asymmetrical* square wave output signal would be generated. For example, if the base voltage of the input transistor 105 where at a higher level than the base of the transistor 115, then the transistor 115 would *prematurely* shut OFF upon application of the positive portion of an input signal and *belatedly* increase in conduction upon application of the negative portion of an input signal. This, of course, would result in the generation of an asymmertical square wave output. This is shown graphically in FIG. 2*b*. The premature shutting OFF of the transistor 115 is indicated by point *f* on the sinusoidal input signal and point *f'* on the output signal. Return of the transistor 115 to quiescent operation and the subsequent increase in conduction thereof are represented by points *g* and *h* respectively on the input signal and points *g'* and *h'* on the output signal. Since the horizontal distance between the points *f* and *g* (and *f'* and *g'*) is not equal to the distance between the points *h* and *i* (and *h'* and *i'*), the square wave output is asymmetrical. This problem is overcome in the circuit described above by means of the parallel inductor-capacitor circuit 145, 150, as discussed.

It should be understood that the circuit arrangement described herein is but illustrative of the application of the principles of this invention. Other arrangements may be devised by those skilled in the art without departing from the spirit and scope of this invention.

What is claimed is:

1. A wave shaping circuit comprising a differential transistor pair having their emitter electrodes connected in common, first means connected to the base electrode of the output transistor of said pair for maintaining the base voltage of said transistor at a constant level, and second means connecting the base electrodes of said pair of transistors for maintaining the base voltages thereof at an equal level during quiescent operation thus allowing for the conversion of a sinusoidal signal to a symmetrical square wave signal.

2. A combination as in claim 1 wherein said first means comprises a positive voltage source connected firstly to the collector of the input transistor, secondly through a resistor to the collector of said output transistor, said collector, in turn, being connected through a capacitor to an output terminal, and thirdly through a resistor to the base of said output transistor, and a Zener diode connecting the base of said output transistor to ground.

3. A combination as in claim 2 wherein said second means comprises a capacitor and an inductor arranged in parallel for maintaining the base voltage of said input transistor at the same level as the base voltage of said output transistor and for blocking the sinusoidal input voltages which are applied through a capacitor to the base of said input transistor thus maintaining a constant voltage level at the base of said output transistor.

References Cited

UNITED STATES PATENTS

| | | | |
|---|---|---|---|
| 2,863,048 | 12/1958 | Theall et al. | 328—31 |
| 3,033,996 | 5/1962 | Atherton | 328—115 X |

JOHN S. HEYMAN, Primary Examiner

S. D. MILLER, Assistant Examiner

U.S. Cl. X.R.

307—235, 268; 328—28; 330—30